United States Patent [19]

Shimada et al.

[11] Patent Number: 4,460,977
[45] Date of Patent: Jul. 17, 1984

[54] OPTICAL MEMORY PLAYBACK APPARATUS

[75] Inventors: Junichi Shimada; Yoshinobu Mitsuhashi; Keisuke Kikuchi, all of Ibaraki; Kenjiro Sakurai, Tokyo, all of Japan

[73] Assignees: Agency of Industrial Science & Technology; Ministry of International Trade & Industry, both of Tokyo, Japan

[21] Appl. No.: 345,391

[22] Filed: Feb. 3, 1982

[30] Foreign Application Priority Data

Feb. 12, 1981 [JP] Japan .................................. 56-19516

[51] Int. Cl.³ .......................... G11C 13/00; G06K 7/10
[52] U.S. Cl. ...................................... 365/106; 250/570
[58] Field of Search ................ 365/106, 215; 250/570, 250/211 J; 455/617, 619

[56] References Cited

U.S. PATENT DOCUMENTS 4,190,775 2/1980 Sakurai et al. ...................... 250/570
4,287,606 9/1981 Lutes, Jr. et al. ................... 455/617

Primary Examiner—Joseph A. Popek
Attorney, Agent, or Firm—Oblon, Fisher, Spivak, McClelland & Maier

[57] ABSTRACT

An optical memory playback apparatus is constructed so that a single longitudinal mode of laser beam emitted from a self-coupling semiconductor laser element is projected through an optical system onto an information recording medium and the laser beam reflected by the information recording medium is returned through the same optical system back to the semiconductor laser element. In addition, the apparatus interposes a spatially uneven phase plate in the optical system, whereby the longitudinal mode of emission of the semiconductor laser element is converted into a random multi-mode at all times and, consequently, the reproduction of information from the information recording medium is effected by detecting the variation in the intensity of output or terminal voltage of the semiconductor laser element which occurs in conformity with the variation in the intensity of the reflected laser beam.

7 Claims, 9 Drawing Figures

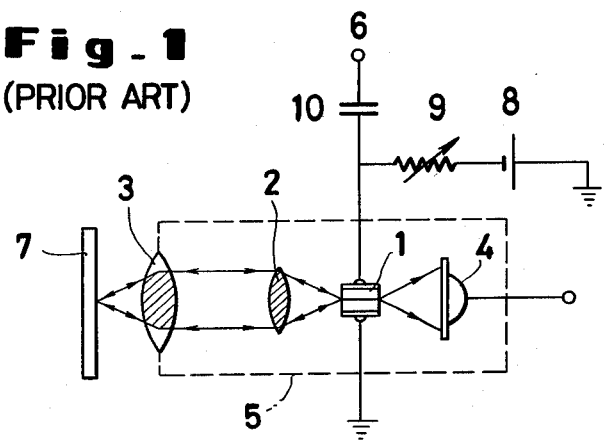
Fig_1 (PRIOR ART)
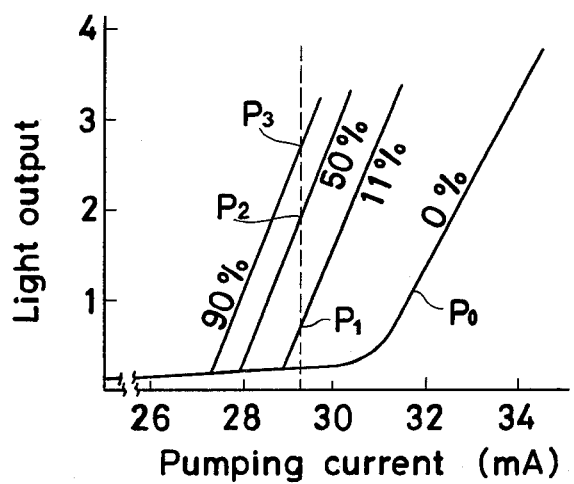
Fig_2
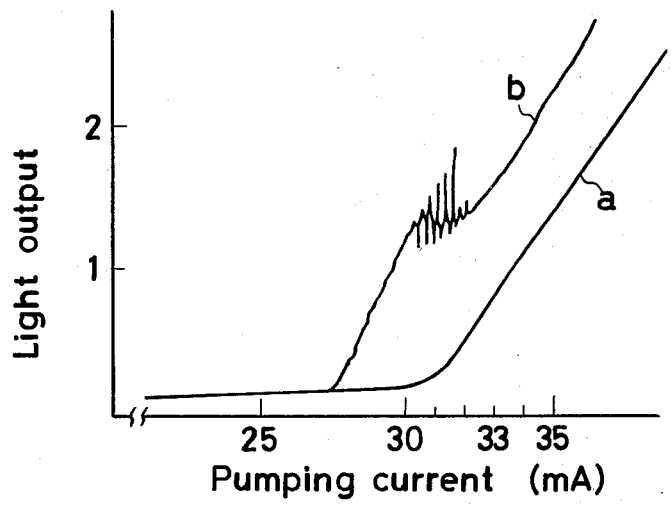
Fig_3

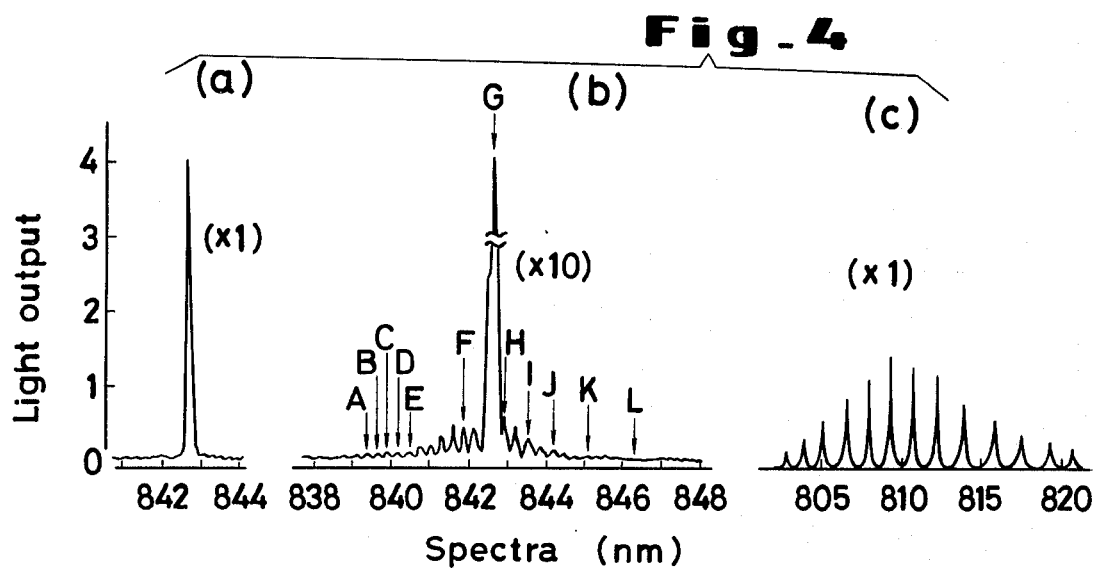
Fig_4
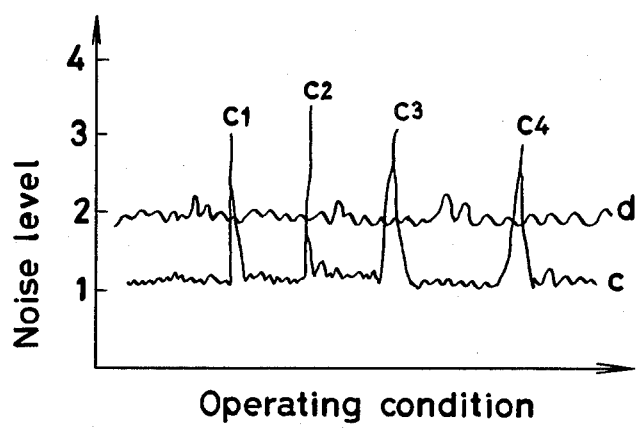
Fig_5
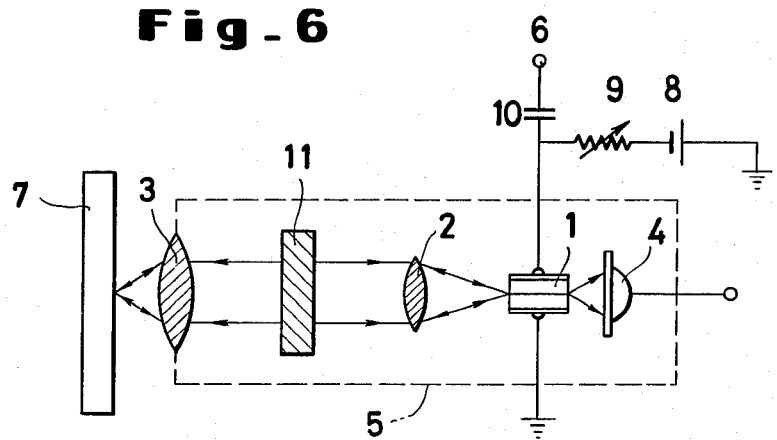
Fig_6

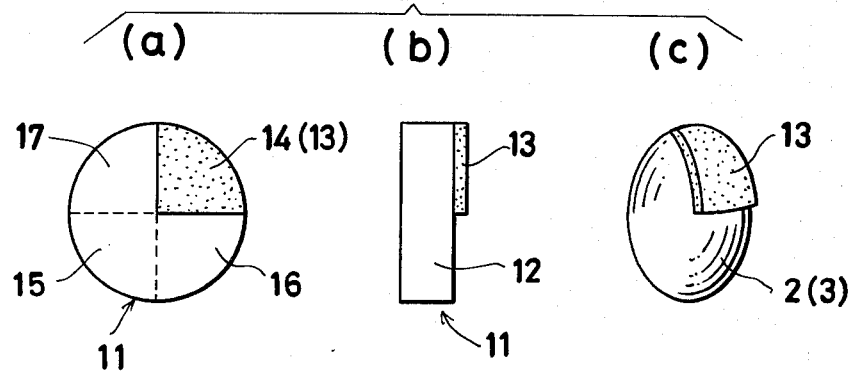
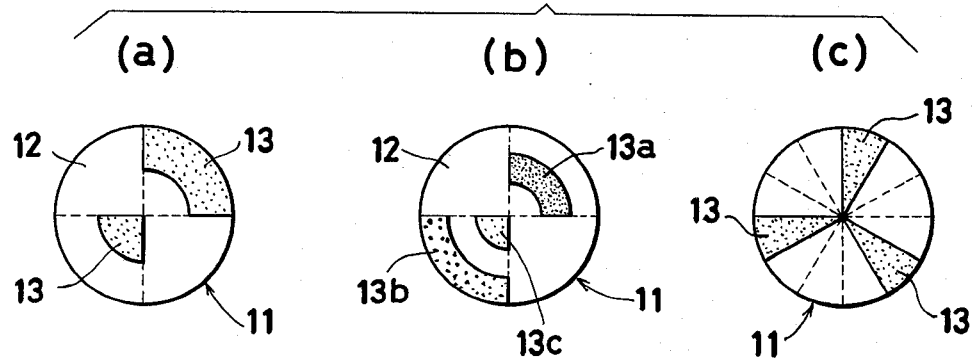
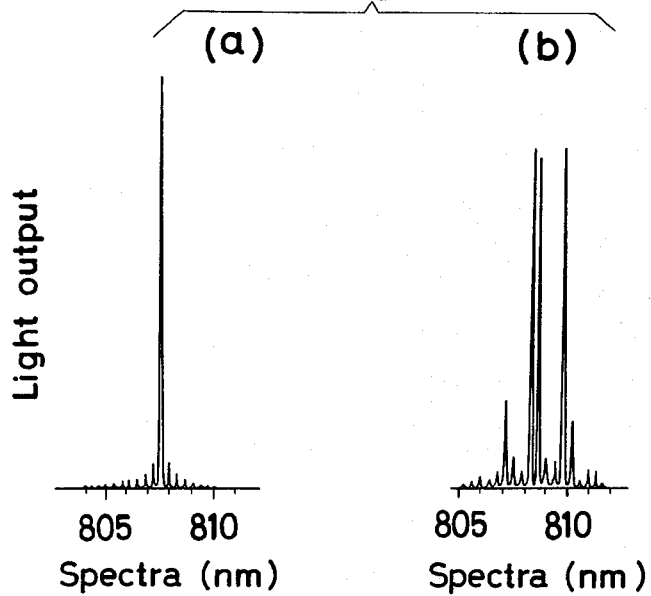

OPTICAL MEMORY PLAYBACK APPARATUS

BACKGROUND OF THE INVENTION

This invention relates to an optical memory playback apparatus using a self-coupling effect semiconductor laser element.

Recently, optical memory playback apparatuses utilizing various forms of optical discs such as video discs otherwise called "picture-producing records," PCM audio discs and optical memories for business use have been developed. These optical memory playback apparatuses are intended to effect reproduction of information, for example, from information recording media such as optical discs by projecting a laser beam or some other beam onto the information recording media and deriving the information in the form of variation in the intensity of the reflected laser beam.

As is well known, a minute electroluminescent semiconductor device of the hundred micron order is commercially available. Early electroluminescent semiconductor devices of this type were not capable of continuously operating without being kept at a very low temperature. Recently available devices, however, can operate continuously at room temperature. U.S. Pat. No. 3,812,477 teaches that such a minute semiconductor laser can be used to read bits of information from a compact memory with a high resolution.

U.S. Pat. No. 4,190,775 suggests an apparatus which effects reproduction of information stored in an information recording medium by projecting a laser beam from a semiconductor laser element onto the recording medium and allowing the return laser beam reflected from the recording medium to impinge upon the laser element thereby causing the laser element, by virtue of a self-coupling effect, to reproduce the information from the recording medium in the form of variation in the optical or electrical intensity. Japanese Patent Application Disclosure No. Sho 56(1981)-137533 proposes an apparatus which effects the same reproduction of information stored in an information recording medium by causing the polarizing plane of the return laser beam reflected from the information recording medium back to the laser element to be rotated by 90° relative to the direction of the incidence of the laser beam, thereby suppressing the self-coupling effect caused in the laser element and causing the laser element to reproduce the information from the recording medium in the form of variation in the intensity of the terminal voltage of the laser element.

SUMMARY OF THE INVENTION

An object of this invention is to provide an optical memory playback apparatus which produces output signals having a high S/N ratio by use of a longitudinally emitted single-mode laser.

To accomplish the object described above according to the present invention, there is provided an optical memory playback apparatus which uses a self-coupling semiconductor element as a light emitting element and incorporates in the optical system thereof a spatially uneven phase plate to convert the single-mode laser emitted longitudinally from the semiconductor laser element into a random multi-mode laser at all times and utilize as for the reproduction of information the intensity of output or terminal voltage of the semiconductor laser element which varies with the laser beam reflected from the information recording medium. In spite of the use of such an element for longitudinally emitting a laser beam, the conversion of the longitudinally emitted single-mode laser into the random multi-mode laser advantageously makes it possible to use the longitudinally emitted single-mode laser in its unaltered form without entailing the conventionally incurred problem of interference caused by the longitudinal emission of the single-mode laser.

The other objects and characteristics of the present invention will become apparent from the further disclosure of the invention to be made hereinbelow with reference to the accompanying drawing.

BRIEF DESCRIPTION OF THE DRAWING

FIG. 1 is a block diagram of a conventional optical memory playback apparatus.

FIG. 2 is a characteristic diagram showing the relation between the pumping current and the relative optical output obtained of the apparatus of FIG. 1.

FIG. 3 is a characteristic diagram showing the relation between the input current and the relative optical output obtained of a self-coupling semiconductor laser element.

FIG. 4 is a graph showing the oscillating spectra of the semiconductor laser element.

FIG. 5 is a graph showing the noise level characteristics of the semiconductor laser element.

FIG. 6 is a block diagram of a first embodiment of the optical memory playback apparatus according to the present invention.

FIG. 7(a) is a front view of one embodiment of the phase plate used in the apparatus of FIG. 6.

FIG. 7(b) is a side view of the phase plate of FIG. 7(a).

FIG. 7(c) is a side view of a second embodiment of the phase plate.

FIG. 8(a) is a front view of a third embodiment of the phase plate.

FIG. 8(b) is a front view of a fourth embodiment of the phase plate.

FIG. 8(c) is a front view of a fifth embodiment of the phase plate.

FIG. 9(a) is a characteristic diagram of the single-mode laser beam emitted longitudinally from a self-coupling semiconductor laser element.

FIG. 9(b) is a characteristic diagram of a random multi-mode laser beam produced after passage of the aforementioned laser beam through the phase plate.

DESCRIPTION OF PREFERRED EMBODIMENTS

First, a miniaturized optical memory playback apparatus utilizing the self-coupling effect of the semiconductor laser element forming the basis of the present invention and disclosed in U.S. Pat. No. 4,190,775 will be described with reference to FIG. 1.

Two lenses 2, 3 are disposed in front of a semiconductor laser element 1 on the output beam side. The lenses 2, 3 form an optical system. Behind the semiconductor laser element 1 is disposed an optical sensor 4. The semiconductor laser element 1, the lenses 2, 3 forming the optical system, and the optical sensor 4 are collectively set within a housing 5 of the shape of a cartridge.

When a power source 8 for supplying a pumping current feeds an electric current to the laser element 1, the laser element 1 emits a laser beam from its output side. The laser beam is converged through the lenses 2, 3 and projected on an information recording medium 7. The laser beam reflected by the recording medium is returned through the same lenses 2, 3 and fed back to the semiconductor laser element 1. Consequently on the semiconductor laser element 1, the return laser beam fed back from the medium 7 induces a self-coupling effect and causes variation in the optical output of the laser element and in the terminal voltage at the sensor terminal 6.

FIG. 2 represents a typical variation in characteristics due to the self-coupling effect. To be specific, it is a characteristic diagram showing the relation between the pumping current and the relative optical output, with the ratio of reflection of the laser beam from the information recording medium 7 as a parameter. From FIG. 2 it is noted that if the pumping current is fixed at a value $I_1$, the value of the optical output is changed to $P_0$, $P_1$, $P_2$, and $P_3$ in proportion as the ratio of reflection is varied to 0%, 11%, 50% and 50%. By sensing these changes in the value of the optical output on the optical sensor 4 by means of a rear output beam, the information stored in the information recording medium 7 can be read out. Since the output of terminal voltage similarly changes in proportion to the variation in the ratio of reflection, the information can also be derived from the variation in the terminal voltage detected by the sensor terminal 6.

During the reproduction of information described above, the focus of the converged laser beam which ought to fall on the surface of the optical disc serving as the information recording medium 7 may fail to remain on the surface because of deviation of the optical disc from its fixed plane of rotation or deviation of the center of the optical disc. A known servomechanism heretofore available for compensating for such deviation and its ill effect on the reproduction involves wobbling the housing 5 in the construction of FIG. 1, forcibly oscillating the converged laser beam in the longitudinal and lateral directions, and utilizing the resultant reflected laser beams as the control signal.

Recent semiconductor laser elements have come to enjoy remarkably improved properties such as prolonged service life and enhanced optical output, for example. Comparable with such remarkable improvements in properties is the improvement achieved in the positive interference property owing to the longitudinal emission of a single-mode laser. The semiconductor laser element used in the conventional playback apparatus described above is of the multi-mode laser emission type, so that the variation in the property of the semiconductor laser element due to the variation in the amount of return laser beam is utilized for the reproduction of information.

Improvement in the various properties of the semiconductor laser element is desirable for the purpose of improving the properties of the optical memory playback apparatus as a whole. For example, the various optical properties of this apparatus are notably improved by using a longitudinal emission single-mode laser as an optical disc pickup in the place of a multi-mode emission laser element. In proportion as the positive interference property, among other properties, is improved, there begins to appear the following property which is detrimental to the application of the aforementioned laser element to the optical memory playback apparatus. With reference to the characteristic diagram of FIG. 3 showing the relation between the pumping current and the relative optical output, the characteristic curve "a" of the optical output devoid of the return laser beam possesses linearity, whereas the characteristic curve "b" having the return laser beam is seen to contain a non-linear portion. Such a non-linear portion is similarly produced in the characteristic curve by a variation in the amount of return laser beam or by a minute phase variation of the return laser beam due to wobbling. Determination of the cause for the occurrence of such a non-linear portion in the characteristic curve, therefore, forms an important prerequisite to the reproduction of information and the acquisition of servo signals. A possible solution to this problem may be found in selecting for the operating point such a value of pumping current as will avoid producing a non-linear portion in the optical output (such as a value of 33 mA in FIG. 3, for example). In this case, however, a value of pumping current falling in the neighborhood of the threshold value which has a high effect of enhancing the optical output due to the return laser beam cannot be selected for the operating point. Thus, this measure cannot give a solution from the standpoint of the configuration of a memory playback apparatus.

This invention incorporates a spatially uneven phase plate in the optical system of an optical memory playback apparatus using a self-coupling semiconductor laser element for longitudinally emitting a single-mode laser so as to convert the single-mode laser longitudinally emitted from the semiconductor laser element into a random multi-mode laser at all times and utilize, as for the reproduction of information, the variation in the intensity of output of terminal voltage of the semiconductor laser element, which occurs in conformity with the variation in the laser beam reflected from the information recording medium. Consequently, the invention is a practical embodiment of the long held theory that use of a semiconductor laser element of longitudinal emission of a single-mode laser is ideal for the optical disc pickup.

The expression "spatially uneven phase plate" as used herein means a plate such that when a bundle of parallel beams of one same phase or a bundle of uniform spherical beams having one same phase curved face is passed therethrough, the spatial phase distribution of the passed beams becomes uneven.

Now, the technical background from which the present invention has issued and the longitudinal mode of the semiconductor laser element will be described.

FIG. 4 is a characteristic curve obtained of the spectrum of the semiconductor laser element by use of a spectroscope. Let "L" stand for the crystal length of the semiconductor laser element and "n" for the index of refraction of the waveguide, and the mode gap $\Delta\lambda$ of Fabry-Perot resonator in the following expression will determine the multiplicity of longitudinal modes to be emitted.

$$\Delta\lambda = \lambda^2/2nL$$

wherein, "C" denotes the velocity of light. The state of the so-called single longitudinal mode of emission as shown in FIG. 4(a) becomes observable when the pumping current is increased to about 1.1 times the threshold value of emission. Here, the single longitudinal mode refers to the case wherein the intensity of the longitudinal mode adjoining the central longitudinal mode ("G" in FIG. 4(b)) becomes less than 1/10 of the intensity of the central longitudinal mode. Also in this case, there exist the multiplicity of longitudinal modes (with intensities several tens of times smaller than the central longitudinal mode) to be determined by the mode gap Δλ as shown in FIG. 4(b). The single longitudinal mode entails the phenomenon called mode hopping which obstructs the practical adoption of this mode similarly to the problem of positive interference property. This phenomenon occurs because the noise level of the semiconductor laser element greatly rises when the longitudinal mode of oscillation abruptly shifts from "G" to "F" or to "I" in FIG. 4(b) because of the variation in the operating condition of the semiconductor of single longitudinal mode of emission, such as, for example, room temperature, pumping current or time. The shift of the mode is so abrupt in fact that suspension of the laser emission will be observed in the transient state in an extreme case.

In the spectrum of the multi-mode emission, a multiplicity of longitudinal mode spectra of rather approximating intensities are observed. Unlike the semiconductor laser of the single longitudinal mode of emission, the semiconductor laser element of multi-mode emission permits ready variation of wavelength due to variation in the operating condition. As shown in FIG. 5, the average noise level (curve "d") of the semiconductor laser element of multi-longitudinal mode is higher than that (curve "c") of the semiconductor laser element of single longitudinal mode of emission. The semiconductor laser element of single longitudinal mode of emission suffers from an abrupt increase of the noise level during the mode hopping ($c_1$, $c_2$, $c_3$, and $c_4$ in FIG. 5). Better stability of service, therefore, may be expected rather from the semiconductor laser element of multi-longitudinal mode of emission. In this respect, efforts are being directed to the development of a semiconductor laser element which has a single lateral mode of emission and a multi-longitudinal mode of emission.

When the semiconductor laser element of single longitudinal mode of emission is used in the miniaturized optical memory playback apparatus, the distance between the element and the information recording medium such as an optical disc (20 to 30 mm) falls within the distance of positive interference (several cm to 1 m or more), with the result that the optical output will be varied even by the variation in the phase of the return laser beam. To be specific, the optical output is varied even by a slight variation in the distance of the return laser beam (such as, for example, a variation of about 0.19 μm, which is about one fourth of the wavelength, 0.78 μm, of the laser beam) and the signal of this variation is overlapped on the information of the optical disc and on the servo signal to cause a great inconvenience. When there is used a self-coupling semiconductor laser element, even the single longitudinal mode of emission is converted into a multi-mode emission so far as the return distance extends to a certain length (20 to 30 mm). It has been found that multi-mode emission is obtained when the number of phase components of the return laser beam through the optical system is more than one and the spatial distribution is not uniform.

Based on this knowledge, the present invention maintains the random multi-longitudinal mode of emission at all times by means of a spatially uneven phase plate which is incorporated in an optical system of the optical memory playback apparatus using a self-coupling semiconductor laser element of single longitudinal mode of emission.

Now, the first embodiment of the present invention will be described specifically with reference to FIG. 6.

Referring to the diagram, a semiconductor laser element 1 is caused by a power source 8 for the supply of a pumping current to issue a laser beam of single longitudinal mode. In front of the semiconductor laser element 1 on the output side thereof, an optical system formed of two lenses 2, 3 is disposed. An optical sensor 4 such as a silicone photodiode is disposed behind the semiconductor laser element 1. The power source 8 for the supply of pumping current as connected to the terminal of the semiconductor laser element 1 via a variable resistor 9 used for adjustment of current. Further to the aforementioned terminal, the terminal 6 for detecting the variation of voltage is connected via a condenser 10 to be used for obstructing the flow of electric current. An information recording medium 7 (optical disc) is disposed where the laser beam is focused by the optical system. For the processing of the signal derived from the optical sensor 4 or the detection terminal 6, there can be used any known processing process such as a processing circuit disclosed in U.S. Pat. No. 4,190,775.

In addition to the configuration described above, the present invention has a spatially uneven phase plate 11 disposed in the optical system. This spatially uneven phase plate 11 is contained in conjunction with the semiconductor laser element 1, the two lenses 2, 3, and the optical sensor 4 in a housing 5 of the shape of a cartridge.

Now, the spatially uneven phase plate 11 to be used for this invention will be described below with reference to FIG. 7.

This phase plate is composed of a substrate 12 and a transparent dielectric film 13 placed to cover one fourth of the surface of the substrate 12. The thickness "d" of this transparent dielectric film 13 is 1/6 of the wavelength λ of the semiconductor laser element, as shown by the following $$d = \lambda/6n_1$$

wherein, $n_1$ denotes the index of refraction of the dielectric film.

The optimum amount of phase variation is not fixed at 1/6 of the wavelength but varies in the range of ¼ to ⅛ according to the kind of semiconductor laser element and the kind of the optical elements (e.g. lenses) used, and according to whether the reproduction of signals from the information medium is effected by utilizing the effect of diffraction of the laser beam by a dent called "a pit" as in the video disc or PCM audio disc or by utilizing the variation in the intensity of the reflected laser beam as in the optical disc memory for business use or the variation in the plane of polarization as in the magnetic optical disc. For example, when the amount of phase variation is fixed at $\pi/3$, the loss of the intensity of the beam is limited to within 10 percent and the dispersion of the beam is so small as to be substantially negligible.

The method for the manufacture of this phase plate will be described specifically below. The substrate is obtained by grinding the opposite surfaces of an optical glass 3 to 5 mm in thickness to a degree of flatness on the order of λ/20 and coating the ground surfaces each with an antireflection film with respect to the wavelength of the semiconductor laser element to be used. On one fourth of one of the two surfaces of the glass, a transparent dielectric film such as of $SiO_2$, $TiO_2$, or $Si_3N_4$ is formed in a thickness such that the variation in phase will equal 1/6 of the wavelength. The deposition of the transparent dielectric film on the substrate can be effected by any of the conventional methods such as, for example, the vacuum deposition method, the sputtering method, and the plasma chemical deposition method.

The shape of the dielectric film 13 to be deposited on the substrate 12 is not limited to that of a quarter circle as shown in FIG. 7(a). The dielectric film 13 may be formed in the shape of a fan along the periphery of one quarter of one of the surfaces of the substrate 12 as illustrated in FIG. 8(a). Alternatively, it may be formed of a plurality of dielectric films 13a, 13b, 13c covering quarters of a circle of various sizes as shown in FIG. 8(b). Otherwise, it may comprise three fan-shaped portions each forming an angle of 30° as illustrated in FIG. 8(c). In these cases, dielectric films of different phases may be formed. Optionally, the aforementioned dielectric film 13 may be formed directly on one part of the surface of a lens 2 (or 3) in the optical system as shown in FIG. 7(c) instead of depositing the film on the glass substrate as described above.

The loci of the laser beam which reciprocates through the phase plate 11 constructed as described above will be considered. The laser beam emitted from the semiconductor laser element and passed through the region 14 occupied by the dielectric film 13 on the phase plate is reflected by the information recording medium 7 and passed through the region 15. Similarly, the laser beam which has passed through the region 16 is reflected and passed through the region 17, the laser beam which has passed through the region 17 is reflected and passed through the region 16, and the laser beam which has passed through the region 15 is reflected and passed through the region 14 formed by the dielectric film. Consequently, the emitted laser beam or the reflected laser beam of one half of the entire luminous flux undergoes a phase variation equalling $\frac{1}{4}$ to $\frac{1}{8}$ of the wavelength relative to that of the remaining half of the luminous flux. This is equal to a statement that the phase of the return laser beam reflected by the information recording medium back to the element comprises two phases. Consequently, the variation in the spectrum of emission of the self-coupling semiconductor laser element owing to the effect of the reflected laser beam, namely the return laser beam, is greater than when the spatially uneven phase plate is omitted from the construction. This means that the single longitudinal mode has been converted to the random multi-longitudinal mode as described above.

Where the spatially uneven phase plate is composed of an aggregate of countless, minute, random phase plates, the phase of the return laser beam becomes extremely random so that the conversion of the mode of emission to the multi-mode by the return laser beam appears to be accomplished with ease. In this case, however, the self-coupling effect cannot be fully utilized firstly because the spot of the emitted laser beam impinging upon the information recording medium grows in size and secondly because substantially all the reflected laser beam fails to return to the semiconductor laser element. For the self-coupling effect to be utilized to the fullest extent, therefore, the size of the spot of the emitted laser beam on the information recording medium should be restricted within 10 percent greater than when the phase plate is omitted from the apparatus and thereby prevented from causing any hindrance to the actual operation of the apparatus, and reduction in the central intensity of the spot of the emitted laser beam should be kept from falling by more than 10 percent, for example. For this purpose it is sufficient to hold the phase shift to no more than about $\lambda/4$.

To cite a working example, in an apparatus of the construction of FIG. 6, a TJS type laser available from Mitsubishi Electric Co., Ltd. of Japan was used as a semiconductor laser element and a BK7 optical glass available from Hoya Glass Co., Ltd. of Japan was coated on each surface with an antireflection film, with $SiO_2$ vacuum deposited to a thickness of about 100 nm in one quarter of one of the two surfaces to form a phase plate.

The aforementioned laser element emitted a laser beam of single longitudinal mode (having a wavelength of 807 nm) as illustrated in FIG. 9(a). When the pumping current to the laser element was increased to about 30 mA, the return laser beam which had passed through the phase plate and been reflected by the medium had a random multi-mode emission as shown in FIG. 9(b). Consequently, the variation in optical output due to the positive interference property was amply lowered to effect a decline of noise as called for.

As described above, this invention can eliminate the effect of the problem conventionally caused by the positive interference property by interposing the spatially uneven phase plate in the optical system of the optical memory playback apparatus using a semiconductor laser element, thereby converting the single longitudinal mode of emission of the semiconductor laser element into a random multi-longitudinal mode at all times and thereby assuring positive utilization of the self-coupling effect. In other words, the optical memory playback apparatus of this invention produces no non-linear portion in the optical output but permits the reproduction of information from the information recording medium to be effected by the detection of the variation in the optical output or terminal voltage of the semiconductor laser element which occurs in conformity with the variation in the intensity of laser beam reflected by the information recording medium. Thus, the present invention permits easy reproduction of information from an optical disc in which information has been recorded in a high concentration. Since the spatially uneven phase plate and the optical system can be integrally formed, this invention has the possibility of making feasible a miniaturized optical sensor and promises application to the multi-pickup system and the optical disc module system. Since this invention further suits the multi-longitudinal mode semiconductor laser element which is now under research, it can be expected to contribute to enlargement of the market for the semiconductor laser element. This invention, accordingly, makes a very large contribution to the optoelectronics technology.

What is claimed is:

1. An optical memory playback apparatus, comprising a self-coupling semiconductor laser element, said laser element emitting a laser beam in a single longitudinal mode of emission, an optical system disposed on the output beam side of said semiconductor laser element, an information recording medium disposed at a focal point of said optical system, means for detecting the variation in the characteristic of said semiconductor laser element, and a spatially uneven phase plate interposed in said optical system, whereby reproduction of information from said information recording medium is effected by converting the single longitudinal mode of emission of the laser beam issued from the semiconductor laser element into a random multi-mode emission while the laser beam is on the way to the information recording medium and subsequently allowing the laser beam reflected by the information recording medium to return to the semiconductor laser element.

2. The apparatus according to claim 1, wherein the means for detection serves to detect the variation in the intensity of optical output from the laser element.

3. The apparatus according to claim 1, wherein the means for detection serves to detect the variation in terminal voltage of the laser element.

4. The apparatus according to claim 1, wherein the phase plate is constructed to that an amount of variation of phase is about ¼ to ⅛ of the wavelength.

5. The apparatus according to claim 4, wherein the phase plate comprises an optical glass plate having opposite surfaces and a transparent dielectric film formed on one quarter of one of the opposite surfaces of the optical glass plate.

6. The apparatus according to claim 4, wherein the phase plate comprises a transparent dielectric film formed on one quarter of the surface of one of the lenses incorporated into the optical system.

7. The apparatus according to claim 5 or claim 6, wherein the dielectric film is formed of $SiO_2$, $TiO_2$, or $Si_3N_4$.

* * * * *